United States Patent [19]

Pommer, II

[11] Patent Number: 4,609,864

[45] Date of Patent: Sep. 2, 1986

[54] ANALOG PROCESS CONTROLLER WITH DIGITAL MONITOR

[75] Inventor: Karl E. Pommer, II, Huntsville, Ala.

[73] Assignee: GTE Communication Systems Corp., Northlake, Ill.

[21] Appl. No.: 670,094

[22] Filed: Nov. 13, 1984

[51] Int. Cl.⁴ .............................................. G05F 1/445
[52] U.S. Cl. .................................... 323/267; 323/274; 323/350
[58] Field of Search ................................ 323/267–268, 323/273–276, 349, 350; 340/636, 661, 663; 320/48

[56] References Cited

U.S. PATENT DOCUMENTS

| | | | |
|---|---|---|---|
| 3,445,746 | 5/1969 | Delatorre | 323/274 X |
| 4,147,969 | 4/1979 | Miller et al. | 320/48 X |
| 4,151,456 | 4/1979 | Black | 323/273 |
| 4,209,710 | 6/1980 | Quarton | 323/274 X |

Primary Examiner—Peter S. Wong
Attorney, Agent, or Firm—Robert J. Black

[57] ABSTRACT

A voltage comparator with both analog and digital outputs. The analog output being useful to control a analog processer such as a voltage regulator while the digital output gives an indication of the controlled state. The present circuitry may be adapted as a lowcost means of adding microprocessor control to an ongoing process whose behavior is dependent upon the state of another parameter such as the voltage exhibited by a non-rechargeable battery supply.

10 Claims, 2 Drawing Figures

ANALOG PROCESS CONTROLLER WITH DIGITAL MONITOR

BACKGROUND OF THE INVENTION

1. Field of the Invention

The present invention relates to a microprocessor controlled telephone which contains a regulated D.C. voltage supply powered by one or more energy sources, and more particularly to a controller which monitors the power source and produces a digital output to the microprocessor to change the energy source.

2. Background Art

A number of microprocessor controlled telephone instruments have been developed for the consumer and business telephone market. Some units, such as the Answercomm II, manufactured by GTE Communication Systems Corporation, have no test or alarm for low battery voltage. Other units, such as Radio Shack's Duofone 160, require a manual "battery test" button to be pushed to determine battery condition. Other units do not adequately sense or manage certain conditions that could occur, e.g. a lower than normal tip and ring voltage when in the "off hook" state requiring switching to battery back up for operating power and/or memory retention. In the case of 110 volt A.C. line powered units, the phone may not be able to sense the loss of the A.C. power source and switch to a battery back up supply; for example, GTE's Answercomm II. A number may have little or no sensing circuitry such that they may, in fact, draw battery power when not required thereby shortening battery life.

For those circuits which do incorporate threshold sensing, the circuitry may be very complex requiring significant current to operate the sense function. Other types of sensing circuits involve use of operational amplifiers or integrated circuit comparators, which, in turn, require a number of external components resulting in more expense and greater power dissipation than in the present invention. Standard commercially available comparators can be subject to influence from ambient noise or instability under certain conditions. Reliability also may not be as good because of the higher complexity and greater number of parts required as associated with the commercially available comparators. In addition, a certain minimum supply voltage is required for most commercial comparators in integrated circuit form, which introduces a complication if the power supply itself is to be sensed and action is to be taken when a low voltage condition exists.

Most techniques utilized do not appear to adequately address the problem of sensing a low battery condition so that a microprocessor can initiate a corrective action procedure.

SUMMARY OF THE INVENTION

The present invention comprises a number of subcircuits including a circuit providing a reference voltage input, a circuit providing a load for the output voltage, and a voltage divider circuit for the feedback signal. The circuit which provides the reference voltage input signal is connected to the base of a first PNP transistor. The PNP transistor's emitter acts as the input terminal for the feedback signal which is coupled to the output of a voltage divider circuit connected between the output voltage terminal and a circuit ground. The divider may be simply a resistive load to circuit ground and a shorting link between the invention's output voltage terminal and the PNP transistor's emitter. Alternately, it may take the form of a resistive voltage divider, or a complex circuit providing frequency compensation. The PNP transistor's emitter and base are shunted by a first resistor. This first PNP transistor's collector is connected to the base of a first NPN transistor. The NPN transistor's collector is tied to an appropriate source such as the output voltage terminal, the input terminal of the feedback signal or the positive voltage supply. The first NPN transistor's emitter and base are shunted by a second resistor. A third resistor is connected between this emitter and circuit ground.

The base of a common emitter connected to second NPN transistor is coupled to the first NPN transistor's emitter by way of a fourth resistor. The second NPN transistor collector is connected to the base of a second PNP transistor by a fifth resistor. This PNP transistor's emitter is powered by either a fixed voltage supply or an enabling logic signal. The collector of the second PNP transistor is connected via another resistor tied to circuit ground and an output terminal for the logic signal used to monitor the state of the analog process. The aforementioned first NPN transistor's emitter is also connected to the base of a common emitter connected to a third NPN transistor by 2 serially connected diode and a resistor. The collector of the third NPN transistor is connected to the base of a fourth NPN transistor and a resistor coupled to an appropriate voltage source such as the positive voltage supply. The fourth NPN transistor's emitter may be connected to either the output voltage terminal or circuit ground. The collector of this NPN transistor is coupled with the base of a third PNP transistor. The emitter and base may be shunted by another resistor. The emitter of the third PNP transistor is connected to the positive voltage supply. The collector is tied to the invention's output voltage terminal where the output load circuit may include a high valued capacitor and resistor.

The feedback signal's input terminal is directly connected to the emitter of a first PNP transistor which performs the function of a voltage difference detector. The base of this PNP transistor is coupled to the aforementioned input terminal through a first resistance shunting the emitter base inputs. At the threshold condition, the characteristic emitter base voltage divided by the shunting resistance defines a current source. This is coupled to the reference voltage circuit which is connected to the base of this PNP transistor.

The base and emitter inputs to the PNP transistor voltage difference detector are analogous to the inputs of an integrated circuit voltage comparator such as National Semiconductor's part no. LM339N. The base of this first PNP transistor is equivalent to the positive input terminal of the voltage comparator. At the threshold condition, the emitter of the PNP transistor is equivalent to the input of a resistive voltage divider whose output is connected to the negative input terminal of the voltage comparator. The voltage drop between the voltage divider's input and the negative input to the voltage comparator represents the emitter base voltage of the PNP transistor.

The collector of the PNP difference voltage detector transistor is directly connected to the base of a first NPN transistor which acts as an intermediate current gain stage. The base and emitter are shunted by a resistor which acts to define the collector current and the related emitter base voltage of the aforementioned PNP transistor at the threshold condition. The collector current required by this NPN transistor is obtained from a voltage source such as the feedback signal's input terminal. Another resistor tied to circuit ground is connected to the second shunting resistor and the emitter of the first NPN transistor to further define the input threshold voltage. It controls the bias current coupled from the first NPN's transistor's emitter to the base of two different NPN common emitter transistors which act as an analog output and a digital output. The base current of the second NPN transistor, forming the digital output circuit, is made purposely several times greater than the base current for the third NPN transistor in the analog output circuit so that the digital signal can be turned on while the analog output is turned off. This gives the digital output the ability to act as an under valued, or no go indicator for the feedback control process when it is turned off. Obviously, the two outputs could easily be reversed to create an over valued no go condition when the new digital output is turned on.

The provision for converting the second NPN transistor's open collector digital output to an output terminated by a resistive load is also provided. Given the need for an under valued "no-go" indicator for the feedback control process, the second NPN transistor's flow of collector current, indicating a controlled, ongoing process, is used to turn on a second PNP transistor switch via a bias resistor coupled to the PNP transistor's base. The PNP transistor's emitter may be either directly coupled to a voltage source or powered by a CMOS microprocessor's enabling logic signal. The resulting logic signal is coupled then to the terminating resistor by the second PNP transistor's collector. This output may then be used by the microprocessor to effect a specific act of events. For example, the user could be notified of a low battery condition which is causing a regulated voltage supply implementation to drop below the regulated value.

The third NPN transistor's open collector representing an analog output signal is generally used to limit an open loop process. In this capacity, it is directly connected to the base of a common emitter fourth NPN transistor whose open loop base current is provided by a bias resistor connected to an appropriate voltage source. This NPN transistor's collector is then coupled to the base of a gating or a third PNP transistor. This PNP transistor's emitter then forms the voltage supply input for the resulting NPN-PNP complimentary darlington type amplifier in the forward gain path of a feedback control system. The collector of the PNP transistor is coupled to some output load and the feedback signal's input terminal to the PNP transistor forming voltage difference detector which acts in conjunction with the reference voltage to perform the function of the summing point in a closed loop feedback control system.

DESCRIPTION OF THE PREFERRED EMBODIMENT

Figure 1:
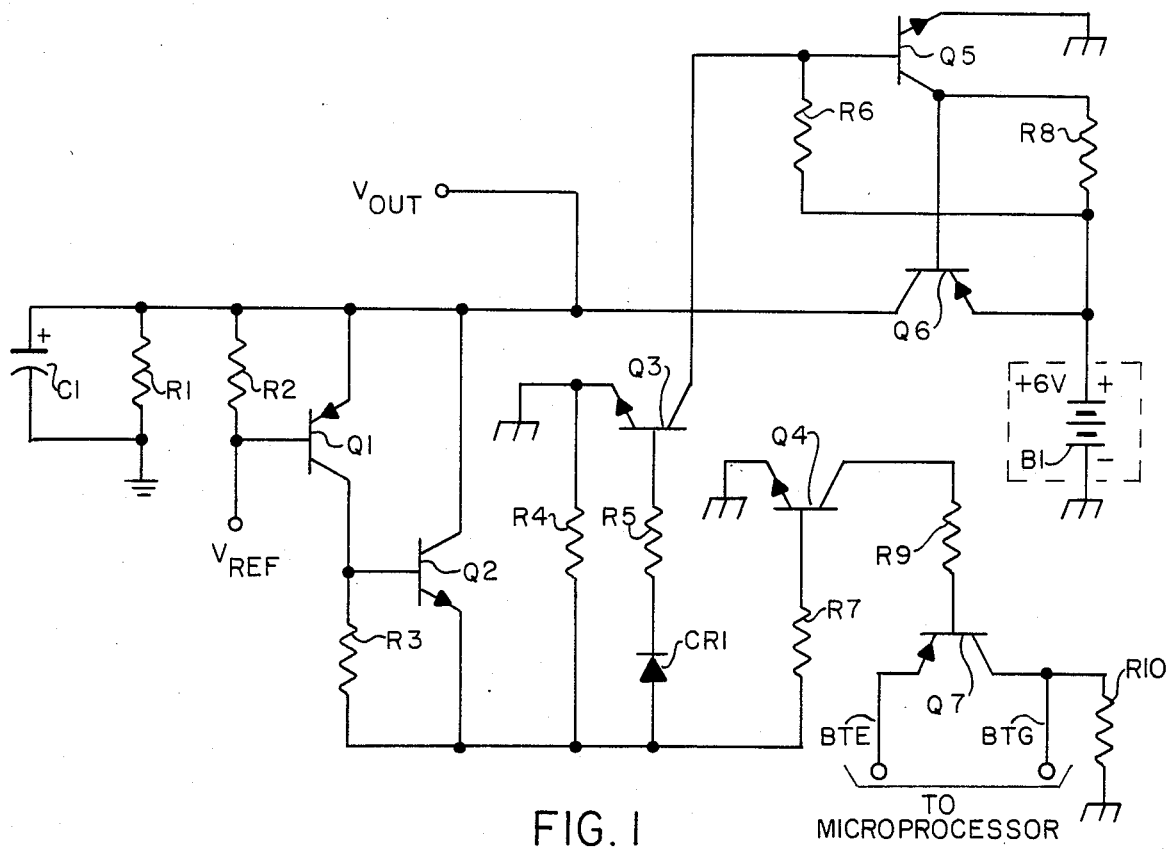
FIG. 1 is a schematic circuit diagram of a closed loop feedback control system for use in a telephone instrument in accordance with the present invention.
Figure 2:
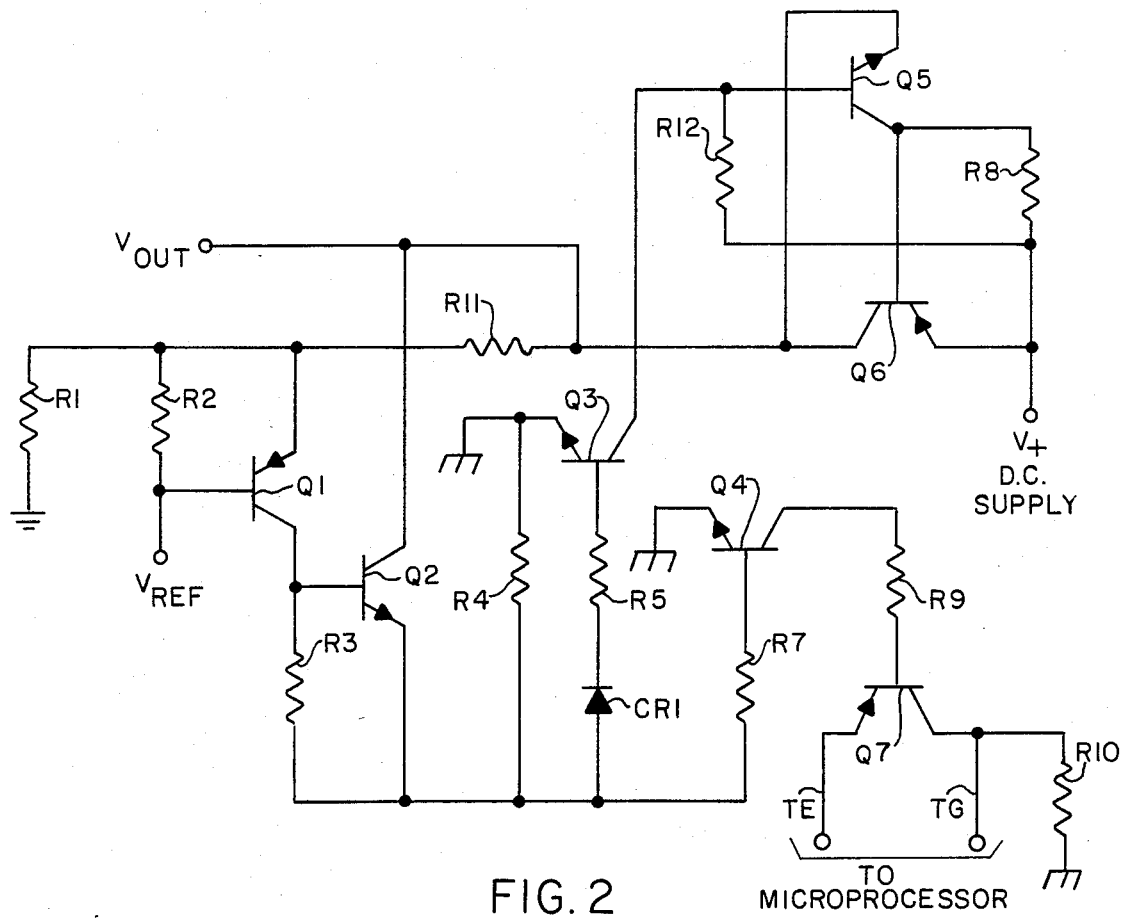
FIG. 2 is a schematic circuit diagram of a closed loop feedback control system for general usage in accordance with the present invention.

Referring to FIG. 1 initially, the input signal for the closed loop, feedback control system is defined by the reference voltage input ($V_{REF}$) applied to the base of voltage difference detector transistor Q1 which is of the PNP type. The emitter of transistor Q1 represents the input terminal for the feedback signal derived from the feedback control system's output voltage. Resistor R2 shunting the emitter base diode of transistor Q1 represents a current source for the reference voltage circuit (not shown) connected to the base of transistor Q1. Transistor Q1 collector sources current to both the base of NPN transistor Q2 and resistor R3 which shunts transistor Q2's base emitter diode. The emitter of transistor Q2 is, in turn, coupled to circuit ground by resistor R4. The emitter of Q2 is also coupled to the base inputs of two NPN common emitter transistors Q3 and Q4 by a resistor-diode branch circuit, consisting of resistor R5 and diode CR1, and a branch circuit made up of bias resistor R7. The digital output transistor Q4 is coupled to the base of PNP transistor Q7 such that transistor Q7's load resistor R10 sees the "BTG" logical output signal when the emitter is enabled by a logic "high" voltage or an appropriate voltage source. The analog output transistor Q3 is coupled to the base of transistor Q5 and resistor R6 which is in turn coupled to the positive voltage supply. The emitter of transistor Q5 may be connected to either direct ground as shown in FIG. 1 or the output voltage terminal as shown in FIG. 2. Transistor Q5's collector is coupled to the base of transistor Q6 to form a complimentary Darlington type amplifier. Resistor R8 may be included across the emitter base diode of transistor Q6. Transistor Q6's emitter is powered by the V+ voltage supply. The output voltage is generated at the collector of PNP transistor Q5. This output circuit can then drive a high value capacitor resistive load as indicated by capacitor C1 and Resistor R1 of FIG. 1. The feedback signal may be either equal to the output voltage as shown in FIG. 1 or be a function of a voltage divider circuit shown in FIG. 2 by resistors R1 and R11. Alternately the voltage divider may be more complex so that frequency compensation may be included in the feedback signal path.

The invention as shown in FIG. 1 is an implementation of a series regulated 3.2 volt D.C. voltage supply which is supplied by a non-rechargeable back up battery supply contained within an on-hook telephone. In the off-hook mode the required power is normally obtained from the telephone subscriber's line. The microprocessor (not shown) periodically tests the "BTG" output in the "on" hook state by applying a logic high to the "BTE" enabling input of the under value, "no-go" indicator for the regulated voltage process. When the "BTG" output becomes a low voltage logic zero, the microprocessor initiates a low battery indication which then can prompt the user to replace the batteries.

The input signal for this closed loop feedback control system is defined by the reference voltage input applied to the base of transistor Q1. This reference voltage is defined, to some extent, by the aforementioned current source supplying power to this reference circuit. When the supply voltage is properly regulated, the emitter base voltage of transistor Q1 exhibits a predefined value which can be related to the threshold condition of the voltage comparator function's analog output transistor Q3. The current source is, therefore, defined by Q1's emitter base voltage divided by the shunting resistance of R2. This definition permits the voltage reference to contain both resistive voltage dropping elements and-/or low voltage zeners which exhibit a gradual breakdown voltage characteristic.

The PNP transistor, Q1, performs the function of a voltage difference detector or summing point for the feedback control system. The input from the voltage reference is applied to the base as previously discussed. The feedback signal ($V_{DD}$) is applied to the emitter and transistor Q1 output collector current and is coupled to the base of transistor Q2. The emitter base voltage of transistor Q2 exhibits a logarithmic relationship, described by the Ebers-Moll model, with transistor Q1's collector current. As a result, the resistor R3 shunting the base emitter diode of transistor Q2 performs a dual function. First it defines a minimum collector current from transistor Q1 which is required to turn on transistor Q2 and to subsequently turn on the voltage comparator's output transistors Q3 and Q4. It also fixes the emitter base voltage of transistor Q1 which is associated with the input threshold voltage. The emitter load resistor R4 is used, in a similar fashion, to fix the operating points at which the two output transistors, Q3 and Q4, are turned on. The base current provided to the digital output transistor Q4 is purposefully made several times larger than the base current to the analog output transistor Q3. This is accomplished by making resistor R5 several times larger than the bias resistor R7 for the voltage comparator's digital output. This implementation also includes the option of adding a silicon diode CR1 in series with resistor R5 to further ensure that digital output transistor Q4 is turned on at a lower input voltage to the emitter of transistor Q1 than the analog output transistor Q3. This gives the digital output transistor Q4, the ability to function as an under valued, "no-go" process indicator with a certain amount of noise immunity. If the two transistors are reversed then the new digital output transistor Q3 would exhibit the function of an over valued, "no-go" process indicator. In this case, when the ($V_{DD}$) voltage supply is increased a sufficient amount above the regulated output value for $V_{DD}$, then this transistor, Q3, would be turned on to indicate that the process was out of control with a high output value.

The under value, "no-go" indicator's digital output transistor Q4 can give a logic output signal with the aid of a simple pull up resistor attached to the V+ supply voltage. Unfortunately, the resulting logic low output causes the pull up resistor to consume power under normal operating conditions. Given the need to conserve a non-rechargeable battery supply, this supply voltage can be a logic signal used to enable the digital output transistor. In this case, the microprocessor (not shown) signals a logic "high" to the "BTE" input at the emitter input of transistor Q7. Transistor Q7 base current flowing through the collector of transistor Q4 causes the terminating resistor R10 and the collector of transistor Q7 to exhibit a logic high output for a controlled process indication. As a result, the microprocessor supplies the necessary power for this test on an as needed basis.

Analog output transistor Q3 of the voltage comparator is used to limit the open loop response in a closed loop feedback control system. In the embodiment shown in FIG. 1 this happens to be a series D.C. voltage regulator which is powered by a battery SUPPLY. The open loop bias current for the process is applied to resistor R6 via the V+ voltage supply. The collector of the analog output transistor Q3 acts as a negative source of bias current which is coupled to the summing point formed by both resistor R6 and the base of the NPN common emitter transistor Q5. The collector of transistor Q5 in turn is connected to the base of the gating PNP transistor Q6. The emitter in this case is tied to a load which includes both capacitor C1 and resistor R1. In addition the feedback signal represented by the Q6 collector's $V_{DD}$ output voltage is applied to the emitter of the PNP voltage difference detector, transistor Q1. The combination of NPN transistor Q5 driving PNP transistor Q6 forms a complementary darlington amplifier in the forward gain path to the summing point represented by the voltage difference detector transistor Q1. The forward gain path from transistor Q1 to the analog output transistor Q3 has the function of a voltage comparator.

In general the output for this feedback control system is defined by the junction formed by the output of the forward gain path and the input to the reverse gain path. At this point the circuit is defined by the collector of PNP transistor Q6. The output voltage at this point can be substantially increased for a given reference voltage or frequency compensated by adding the voltage divider such as indicated in FIG. 2 by resistors R1 and R11. The digital output transistor Q4 retains its function as either an under value or over value indicator for the output of the generalized feedback control system of FIG. 2.

While only a single embodiment and a minor modification thereof of the present invention has been shown, it will be obvious to those skilled in the art that numerous modifications may be made without departing from the spirit of the present invention which shall be limited only by the scope of the claims appended hereto.

I claim:

1. An analog controller with digital monitor comprising: a source of DC power; controller output means; gating means connected between said DC power source and said controller output means; a voltage difference detector connected to a reference voltage source and including a feedback connection from said output means, operated in response to the difference between said reference voltage and the voltage of said output means; an analog signal output connected between said detector and said gating means operated in response to said operated detector means to operate said gating means to control the flow of DC voltage from said power source to said controller output means; switching means including circuit connections to an associated digital processor; a digital signal output connected between said detector and said switching means operated in response to said operated detector means to condition said switching means to transmit an enabling signal to a connected digital processor, said enabling signal transmitted in response to an enabling signal from said digital processor supplied to said conditioned switching means.

2. An analog controller with digital monitor as claimed in claim 1 wherein: there is further included current gain means connected between said voltage difference detector and both said analog and digital signal outputs.

3. An analog controller with digital monitor as claimed in claim 1 wherein: said gating means comprise first and second transistors arranged in a Darlington configuration.

4. An analog controller with digital monitor as claimed in claim 1 wherein: said voltage difference detector comprises a transistor.

5. An analog controller with digital monitor as claimed in claim 4 wherein: said transistor is of the PNP type.

6. An analog controller with digital monitor as claimed in claim 2 wherein: said current gain means comprises a transistor of the NPN type.

7. An analog controller with digital monitor as claimed in claim 1 wherein: said analog signal output comprises transistor of the NPN type.

8. An analog controller with digital monitor as claimed in claim 1 wherein: said digital signal output comprises a transistor of the NPN type.

9. An analog controller with digital monitor as claimed in claim 1 wherein: said switching means comprise a PNP transistor with said circuit connections to said associated digital processor are connected to the emitter and to the collector of said PNP transistor.

10. An analog controller with digital monitor as claimed in claim 1 wherein: said source of DC power comprise a battery.

* * * * *